United States Patent
Battersby et al.

(10) Patent No.: US 6,414,369 B1
(45) Date of Patent: Jul. 2, 2002

(54) THIN FILM CAPACITOR ELEMENT

(75) Inventors: Stephen J. Battersby, Haywards Heath; Darren T. Murley, Horley; John M. Shannon, Whyteleafe, all of (GB)

(73) Assignee: Koninklijke Philips Electronics N.V., New York, NY (US)

( * ) Notice: Subject to any disclaimer, the term of this patent is extended or adjusted under 35 U.S.C. 154(b) by 0 days.

(21) Appl. No.: 09/545,106

(22) Filed: Apr. 6, 2000

(30) Foreign Application Priority Data

Apr. 7, 1999 (GB) .............................................. 9907910

(51) Int. Cl.$^7$ ............................. H01L 29/00; H01G 2/12
(52) U.S. Cl. ....................... 257/532; 257/533; 257/534; 257/535; 257/355; 438/255; 438/398; 438/665; 438/957; 438/964; 361/15; 361/91.5
(58) Field of Search ........................ 257/532, 533–535, 257/355; 361/15, 91.5; 438/255, 398, 665, 957, 964

(56) References Cited

U.S. PATENT DOCUMENTS 5,614,727 A    3/1997   Mauri et al. ................... 257/43
5,719,647 A  * 2/1998   Fujikawa et al. ............. 349/40

FOREIGN PATENT DOCUMENTS

GB        2268328 A      1/1994
GB        2268328 A  *   5/1994

OTHER PUBLICATIONS

IBM Technical Disclosure Bulletin, vol. 24, No. 11B Apr. 1982, pp. 6040–6041.
"Effect of Heat Treatment on the Coefficient Bpf for the Poole–Fenkel Effect and the Conductivity in Ta2O3 Films", by H. Matsumoto et al, Japanese Journal of Applied Physics, vol. 19, No. 1, Jan. 1980, pp. 71–77.
"Current–Voltage Characteristics of MIM Element and its New Experimental Formula", By T. Hirai et al., ASIA Displays 1995.

* cited by examiner

Primary Examiner—Tom Thomas
Assistant Examiner—Donghee Kang
(74) Attorney, Agent, or Firm—Steven R. Biren

(57) ABSTRACT

A thin film capacitor is provided with a thin film protection element to protect the capacitor from damage that can result due to the occurrence of an electrostatic discharge event. The thin film capacitor includes two conductive film portions forming capacitor plates and a dielectric film forming the capacitor dielectric. The protection element may take the form of a thin film diode or a series of thin film diodes connected electrically in parallel with the thin film capacitor. The whole device can be fabricated using a stoichiometric silicon nitride layer to produce the capacitor dielectric and a non-stoichiometric silicon rich silicon nitride layer to provide the diode semiconductor material. One diode is formed by one capacitor plate, the semiconductor layer and an upper diode contact. In an alternative construction the protection element takes the form of a narrow gap defined by one conductive film portion electrically connected to one capacitor plate and another conductive film portion electrically connected to the other capacitor plate. During an electrostatic discharge event charge is able to cross the narrow gap rather than pass through the capacitor dielectric material.

11 Claims, 5 Drawing Sheets

THIN FILM CAPACITOR ELEMENT

BACKGROUND OF THE INVENTION

The present invention relates to a thin film capacitor and in particular to such a capacitor provided with protection against damage that can be caused by the application of voltages in excess of the maximum intended operating voltage of the capacitor. This can occur, for example, during an electrostatic discharge event.

Electronic components in general can be damaged when they are subjected to voltages greater than their intended operating voltage as may occur when a build up of electrostatic charge is applied to that component. In the case where the component is a capacitor, as the applied voltage increases above the maximum intended operating voltage of the capacitor, a point is reached where the dielectric of the capacitor begins to conduct. This causes heating of the capacitor dielectric and eventual failure of the component. Components are particularly vulnerable to electrostatic discharge damage when being handled, for example during assembly of the component onto a printed circuit board.

IBM Technical Disclosure Bulletin, Volume 24, Number 11B at page 6040 to 6041 discloses connecting a diode across a thin film decoupling capacitor to prevent damage occurring to the capacitor due to an electrostatic discharge event. The diode is formed using a p-n junction in a silicon substrate of the capacitor.

In this case it is necessary to use a silicon substrate and to include dopants for the p-type and n-type conductivities. The introduction of such dopants in the reaction chamber can be a source of contamination to other parts of the device being fabricated, and the manufacture of such a device is complex and expensive.

SUMMARY OF THE INVENTION

In accordance with the present invention there is provided a thin film capacitor comprising a thin film structure on an insulating substrate, wherein the thin film structure provides a capacitor element including a dielectric film of the capacitor, and first and second conductive film portions which each provide a capacitor plate, and wherein the thin film structure also provides a protection element connected electrically in parallel with the capacitor element, the protection element having a conduction path that operates at a voltage lower than the breakdown voltage of the capacitor dielectric film.

This thin film structure in accordance with the invention is advantageous for protecting the thin film capacitor against damage that may otherwise result due to the application of a voltage in excess of the intended operating voltage of the capacitor. Preferably at least one of the first and second conductive film portions also provides an electrode of the protection element. This feature offers the advantages of simplified fabrication, a compact structure and an opportunity to produce the thin film capacitor at low cost.

The protection element may be a thin film diode. The diode may include, for example, a material of silicon rich non-stoichiometric silicon nitride. A number of such devices may be connected in series.

Other forms of the protection element may include, for example a discharge gap or a resistive element between conductive film portions. These conductive film portions may comprise third and fourth conductive film portions, the third conductive film portion is in electrical connection with one of the first and second conductive film portions, and the fourth conductive film portion is in electrical connection with the other one of the first and second conductive film portions. Each of the third and fourth conductive film portions may be integral with it's associated first or second conductive film portion.

Other aspects and optional features of the present invention appear in the appended claims.

Thus, in accordance with the present invention the thin film capacitor element has an associated thin film protection element.

Furthermore, the thin film capacitor element has an associated thin film protection element that may be produced on the same substrate. The substrate may be an arbitrary insulating material.

BRIEF DESCRIPTION OF THE DRAWING

Embodiments of the present invention will now be described by way of example only with reference to the accompanying diagrammatic drawings in which.

Figure 1:
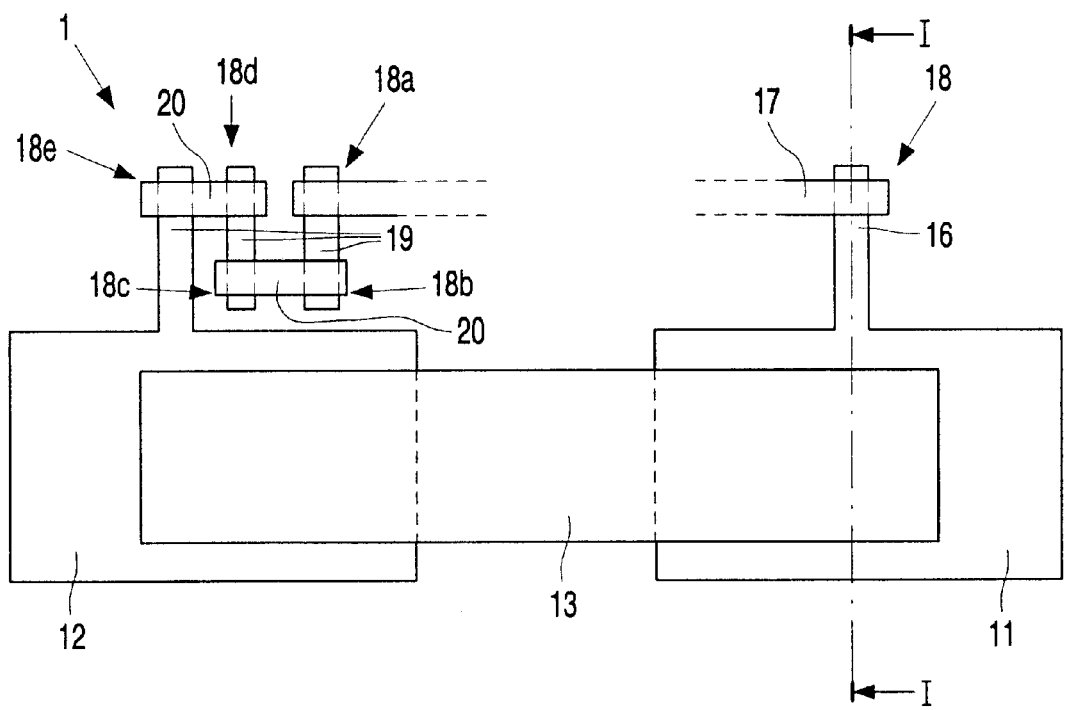
FIG. 1 is a plan view of a first embodiment of a thin film capacitor of the present invention.

It should be noted that the drawings are diagrammatic and not drawn to scale. Relative dimensions and proportions of parts of the Figures have been shown exaggerated or reduced in size for the sake of clarity and convenience in the drawings. The same reference signs are generally used to refer to corresponding or similar features in the different embodiments.

DESCRIPTION OF THE PREFERRED EMBODIMENTS

Figure 2:
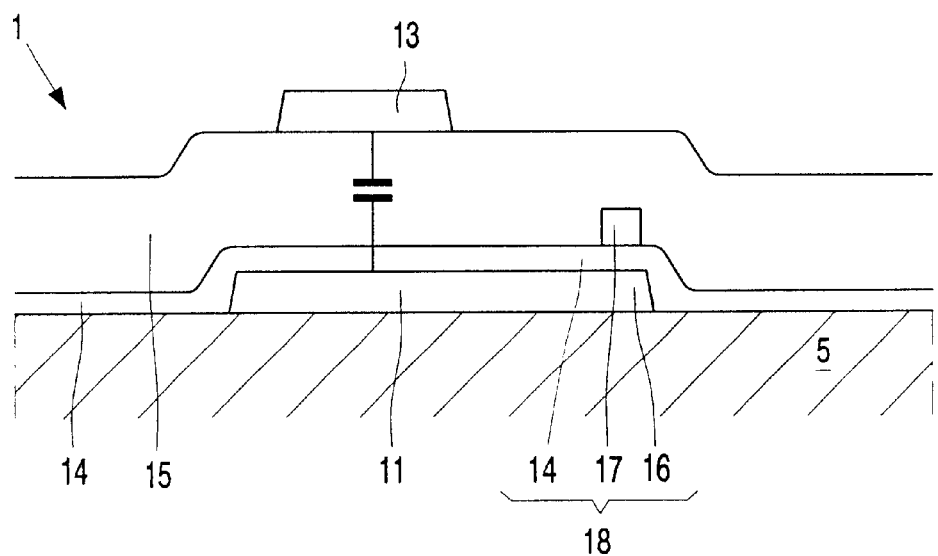
FIG. 2 is a cross sectional view along the line I—I of FIG. 1.

Referring to FIGS. 1 and 2 a thin film capacitor 1 is formed as a thin film structure on an insulating substrate 5. The substrate may comprise, for example, a ceramic or glass. The capacitor includes a thin film capacitor element which comprises a first conductive film portion 11 to form a first capacitor plate and a second conductive film portion 12 to form a second capacitor plate. A third conductive film portion 13 is arranged such that it forms overlapping regions with at least part of the first conductive film portion 11 and at least part of the second conductive film portion 12, although there is no direct contact between any of the three conductive film portions. The third conductive film portion 13 may be thought of as a capacitor intermediate plate.

The third conductive film portion 13 is separated from the first and second conductive film portion by layers 14 and 15. Layer 14 is a semiconductor material and layer 15 is an insulating dielectric material. The dielectric layer (in this case layer 15) is thicker than the semiconductor layer (in this case layer 14), so that even when the semiconductor layer 14 and the insulating layer 15 are formed as two adjacent layers, the dielectric properties of layer 15 are dominant. Together, the layers 14 and 15 therefore serve as a capacitor dielectric between the overlapping regions of the first conductive film portion 11 with the third conductive film portion 13 and the second conductive film portion 12 with the third conductive film portion 13. In order to use the capacitor in an electrical or electronic circuit, electrical connection is made with the first capacitor plate (first conductive film portion 11) and the second capacitor plate (second conductive film portion 12) and contact electrodes may be provided for this purpose as will be apparent to the person skilled in the art. The substrate 5, semiconductor layer 14 and insulating layer 15 are not shown in FIG. 1.

A first diode first contact (electrode) is provided in the form of lower diode terminal 16 which is in electrical connection with the first conductive film portion 11 (first capacitor plate). Furthermore, with reference to FIG. 1, it is noted that the lower diode terminal 16 is an integral part of the first conductive film portion 11 which advantageously simplifies the fabrication process and reduces production costs. However, it is also noted that it is not essential for the lower diode terminal 16 to be integral with one of the capacitor plates. A first diode second contact (second electrode) is provided in the form of diode upper terminal 17 which is positioned in contact with that surface of the semiconductor layer 14, which is remote from the first conductive film portion 11. A metal-semiconductor-metal structure is now provided by the first diode lower terminal 16 (first film portion 11), semiconductor layer 14 and first diode upper terminal 17 which forms a first thin film diode (TFD). The first diode is denoted in FIGS. 1 and 2 by reference numeral 18. By establishing electrical contact between the first diode second contact 17 and the second conductive film portion 12, the first diode will become connected electrically in parallel with the capacitor element of the capacitor 1 to provide the capacitor with an integral protection element. In practice one or more such diodes can be connected between the first conductive film portion 11 (first capacitor plate) and the second conductive film portion 12 (second capacitor plate), depending on the protection required and intended operating parameters of the thin film capacitor 10. A number of such diodes connected in parallel could be provided.

A thin film diode (TFD) 18 that is formed by a layer of silicon rich silicon nitride (layer 14 in the above example) sandwiched between two metal layer contacts (typically of chromium and molybdenum), is a simple cross-over device. The nitrogen content of the silicon rich silicon nitride is sufficiently low that it behaves as a semiconductor, so that the thin film diode device can be thought of as a back-to-back Schottky diode in which tunnelling through the barrier at each metal-silicon nitride interface limits the current flow. The thin film diode is a generally symmetrical device. The bulk of the metal layer contacts can be of AlCu with a surface also of AlCu. Alternatively the surface could be Mo or Cr.

When the capacitor is operating within the range of intended operating voltages the protection element offers a very high resistance to current flow. Should the capacitor be subjected to voltages in excess of those intended operating voltages, a potential difference results between the first film portion 11 and second film portion 12 which is in excess of the intended operating parameters of the device. Under these conditions the electrical resistance of the protection element will reduce significantly to allow current flow therethrough in either direction between the first conductive film portion 11 and the second conductive film portion 12. This serves to prevent or reduce current flow through the capacitor dielectric. By preventing at least some current flowing through the capacitor element itself (as may occur due to the application of excessive voltage) the risk of damage occurring to the capacitor and in particular to the dielectric of the capacitor is reduced.

It will be apparent that the protection element needs to be designed so that when the capacitor is subjected to a voltage within the normal intended operating voltage range, the protection element has a very high resistance to avoid affecting the normal operation of the capacitor element. Furthermore the protection element should have a very low capacitance in comparison with the capacitor element itself. When the capacitor is subjected to a voltage in excess of the normal intended operating voltage range, and in particular when the excess voltage is large enough to cause damage to the capacitor, the resistance of the protection element should fall quickly enough to allow the passage of current without significant delay; that is the reaction time should be such that the protection element allows passage of current before damage to the capacitor occurs.

An indication of how soon the protection element needs to reduce it's resistance to offer useful protection may be obtained from the so-called human body model discharge event. This simulates the effect of a person carrying charge handling a device. The test involves charging a 200 pF capacitor with a voltage in the order of one or two kilo volts and then discharging stored charge through a device under test. The test is repeated with the capacitor being charged with progressively higher voltages, until the device under test fails. Where the device under test is a thin film capacitor, maximum current flows through the device a few nano seconds after discharging begins, due to the presence of an inductance. If, for example, maximum current flows 4 to 5 nano seconds after discharging begins, the protection element will need to exhibit a low resistance by this time also.

This means that in the above example the thin film diode needs to allow passage of current soon enough to prevent damage occurring to the capacitor. The current flow through the thin film diode is preferably within the normal current-voltage characteristics of the thin film diode but the thin film diode may undergo breakdown. In the latter case it is highly desirable that the breakdown is reversible. If one diode is used as described above, the diode must have a turn on voltage (or breakdown voltage) higher than the normal intended operating voltages of the capacitor element. In order to further increase the voltage required before the protection element begins to conduct significantly (the element turn-on voltage) the protection element may consist of a number of thin film diodes connected in series in place of the single thin film diode. In this case the voltage applied to the protection element will be divided across the plurality of diodes. Since the protection element will only begin to conduct as the turn on (or breakdown) voltage of each of the diodes is reached, a greater voltage may be applied to the protection element as a whole before it begins to conduct.

This arrangement is illustrated in FIG. 1 where the first diode second contact terminal 17 is not directly connected to the second conductive film portion 12 but is connected to a contact terminal of a second thin film diode 18a. A number of such thin film diodes (18, 18a, 18b, 18c, 18d, 18e) are electrically connected in series between the first conductive film portion 11 and the second conductive film portion 12 so that only a fraction of the potential difference applied across the first 11 and second 12 thin film portion will appear across each thin film diode. Thus for a given type of thin film diode increasing the number of such diodes connected in series will allow an increase in the potential difference that may be applied across the first 11 and second 12 conductive film portions before the protection element (formed by diodes (18, 18a, 18b, 18c . . . ) begins to conduct.

Preferably the protection element should survive the application of excessive voltages, including an electrostatic discharge event in order to provide continued protection to the capacitor element. The current and voltage handling capacity of the protection element may be improved by increasing the area of the or each thin film diode. Other ways of improving voltage handling capacity include increasing the number of diodes while keeping the area fixed and/or increasing the thickness of the metal contact terminals.

The current and voltage handling capacity of the protection element can also be improved by providing a number of diodes connected in parallel between the first conductive film portion 11 and the second conductive film portion 12 and/or a number sets of series connected diodes with each series connected in parallel between the first conductive film portion 11 and the second conductive film portion 12.

As already mentioned, the device illustrated in FIGS. 1 and 2 uses a semiconductive layer 14 of non-stoichiometric silicon rich silicon nitride and the dielectric layer 15 is of stoichiometric silicon nitride. The use of silicon nitride for producing both layers means that each of the layers may be produced in the same reactor during fabrication of the capacitor and the composition of deposited material may be governed merely by changing conditions in the reactor.

One production process suitable for the fabrication of a device as illustrated in FIG. 1 or FIG. 2 is comprised of a number of steps as will now be described.

The first bottom metal layer is deposited onto an insulating substrate 5 and suitably patterned by etching to provide the first conductive film portion 11/16, the second conductive film portion 12 and first (bottom) diode terminals 19 of further diodes (18a, 18b, 18c, 18d . . . ) as required. Non stoichiometric silicon rich silicon nitride is then deposited to form the semiconductor layer 14 of the first diode 18 and any further diodes 18a, 18b . . . . A second metal layer is then deposited and patterned to form the first diode second contact (electrode), that is diode upper terminal 17, and second (top) diode terminals 20 of further diodes 18a, 18b, 18c . . . as required.

Stoichiometric silicon nitride is then deposited to form a capacitor dielectric layer 15. Next a contact hole is opened through the silicon nitride layers 14 and 15 for each of the first and second conductive film portion, 11 and 12 respectively. A third metal layer is then deposited and patterned to provide the third conductive film portion 13 and contacts (not shown) to the first conductive film portion 11 and the second conductive film portion 12. In this manner it is advantageously possible to fabricate a capacitor element having a protective element comprising of one or a number of thin film diodes that requires only three metallisation stages and the deposition of two silicon nitride layers.

In an alternative embodiment the or each thin film diode may be replaced by a MIM device, for example a tantalum pentoxide ($Ta_2O_5$) MIM device. A MIM (metal insulator-metal) device is also a simple cross-over diode in which current flows between a first contact layer (typically of tantalum) and a second contact layer (typically made of tantalum, chromium, tin or indium tin oxide). Current flow between the first and second contact layers is controlled by an interposed layer. The interposed layer is often comprised of $Ta_2O_5$ which is formed by anoidic oxidation of the first contact layer that is chosen to be of tantalum. The I(V) characteristics of a typical $Ta_2O_5$ MIM device can be tailored by suitable heat treatments in a manner described in the publications Japanese Journal of Applied Physics Volume 19, Number 1, January 1980, pp. 71–77 and ASIA Display '95 P2.2-1 pp. 453–456 "Current Voltage Characteristics of MIM Element and its New Experimental Formula (Hirai et. al.). For the embodiment illustrated in FIGS. 1 and 2 the layer 14 will be of $Ta_2O_5$.

While the device shown in FIG. 1 and 2 has a lower semiconductor layer 14 and an upper insulating dielectric layer 15, the layers could be reversed so that the thicker insulating dielectric layer 15 is deposited first and the thinner semiconductor 14 is deposited thereon. Indeed the whole device could be produced on the substrate 5 in an arrangement that is inverted in comparison with the device shown. Furthermore, it is not essential that the first and second capacitor plates are formed by the first conductive film portion 11 and the second conductive film portion 12. In one alternative construction an intermediate capacitor plate is not employed and the more traditional arrangement of two parallel plates is adopted. In one such implementation the first conductive film portion 11 is retained as the first capacitor plate but the second capacitor plate is provided by third conductive film portion 13 in which case it may be preferable to increase the area of overlap between the first conductive film portion 11 and the third conductive film portion 13. The protection element is then electrically connected between the first conductive film portion 11 and the third conductive film portion 13.

Figure 3:
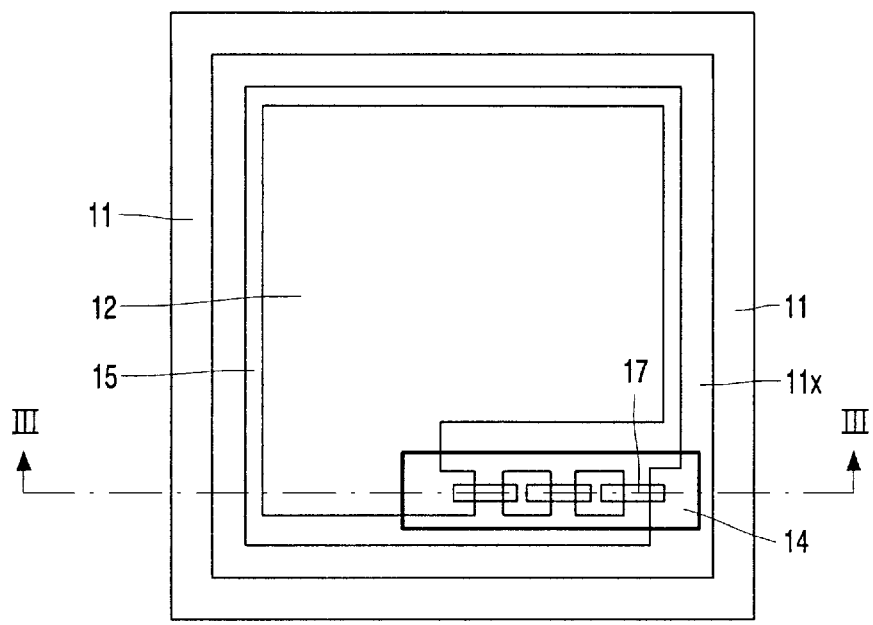
FIG. 3 is a plan view of a second embodiment of a thin film capacitor of the present invention.
Figure 4:
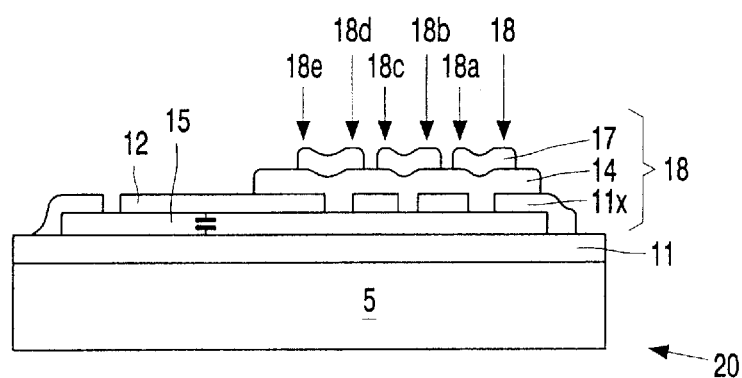
FIG. 4 is a cross sectional view along the line III—III of FIG. 3.
Figure 5:
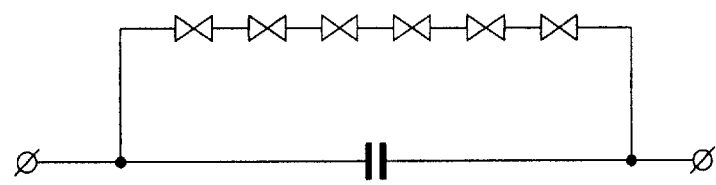
FIG. 5 is a circuit diagram representing the electrical circuit equivalent of the second embodiment.

Referring to FIGS. 3 and 4 a second embodiment of the thin film capacitor 20 is shown. As in the previously described example the device is formed on a substrate 5, but has a first capacitor plate formed by a first conductive film portion 11 on one level and a second capacitor plate formed by a second conductive film portion 12 on a different level to the first conductive film portion 11. The capacitor dielectric is provided by an insulating dielectric layer 15 which may be of stoichiometric silicon nitride as described in the previous example. Again the protection element can be provided in the form of a thin film diode 18 or, as shown in FIGS. 3 and 4, a number of series connected thin film diodes 18, 18a, 18b, 18c, 18d . . . connected electrically in parallel with the first and second capacitor plates. The cross-section of the diodes is shown in FIG. 4 which illustrates an extended section 11x of the first conductive film portion 11 to form a first contact (electrode) 11x of a first thin film diode 18. A semiconductor layer 14, which in this example is of silicon rich silicon nitride and a second contact (electrode) 17 are also provided to form the first thin film diode. The second contact 17 may be electrically connected to the second capacitor plate (second conductive film portion 12) if a number of series connected diodes are not required, otherwise the second contact 17 is connected to a contact terminal of a further thin film diode 18a, as is the case in the embodiment as illustrated. A number of such further diodes 18a, 18b, 18c . . . in series are thus electrically connected between the first conductive film portion 11 and the second conductive film portion 12, that is the string of diodes are electrically connected in parallel with the capacitor. As with the first embodiment, various arrangements and constructions of the thin film diodes are possible to vary the current and voltage handling capacity of the protection element, as well as its operational characteristics.

Furthermore, in this second embodiment the thin film diodes may alternatively be MIM devices of the type described above.

Figure 6:
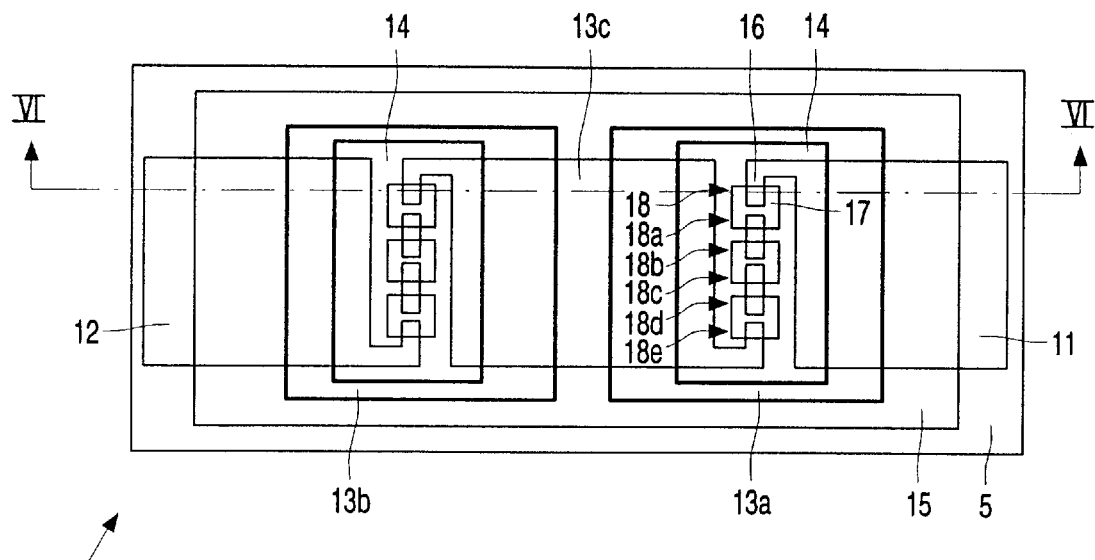
FIG. 6 is a plan view of a third embodiment of a thin film capacitor of the present invention.
Figure 7:
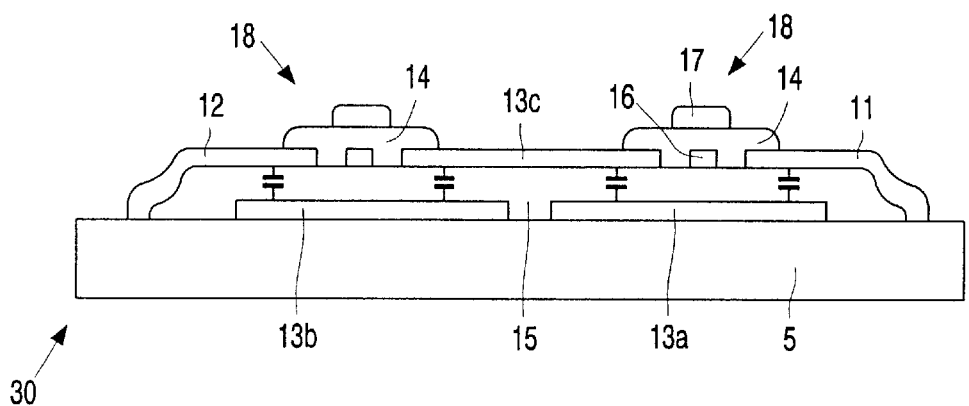
FIG. 7 is a cross sectional view along the line VI—VI of FIG. 6.
Figure 8:
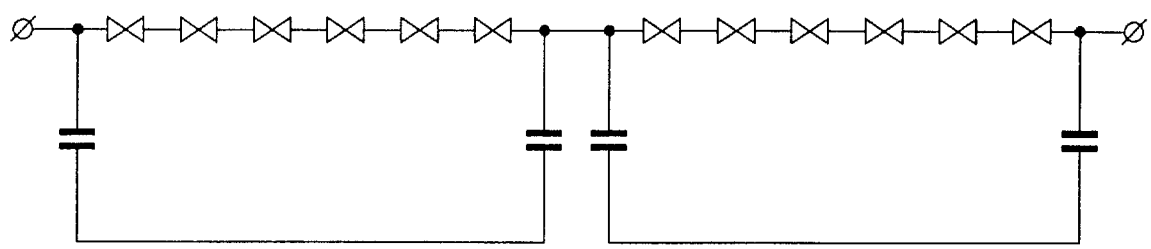
FIG. 8 is a circuit diagram representing the electrical circuit equivalent of the third embodiment.

Referring to FIGS. 6 and 7 a third embodiment of the thin film capacitor 30, is shown formed on a substrate 5. A first conductive film portion 11 provides a first capacitor plate which is also one terminal of the capacitor. A second conductive thin film portion 12 provides a second capacitor plate which is also the other terminal of the capacitor. The first conductive film portion 11 forms a region of overlap with a first buried conductive film portion 13a and the second conductive film portion 12 forms a region of overlap with a second buried conductive film portion 13b, although in each region of overlap the conductive film portions are not in direct electrical contact. A further linking conductive film portion 13c forms overlapping regions with the first and second buried conductive film portions, 13a, 13b, although in each region of overlap the conductive film portions are not in direct electrical contact. Indeed, this embodiment may be considered to include two capacitor elements connected in series.

The capacitor dielectric is provided by an insulating dielectric layer 15 which may be of stoichiometric silicon nitride as described in the previous examples. Alternatively, the layer 15 may be of a different insulating material, for example silicon oxide. The capacitor is provided with two protection elements. A first protection element is electrically connected between the first conductive film portion 11 and linking conductive film portion 13c. A second protection element is electrically connected between the second conductive film portion 12 and the linking conductive film portion 13c. Each protection element includes a plurality of thin film diodes 18 electrically connected in series. The protection elements shown each contain six thin film diodes 18, 18a, 18b, 18c, 18d, 18e connected in series although each protection element may alternatively contain a different number or protection elements. The protection element may contain only one diode although this is not usually preferable. The cross-sectional view of diode 18 shows a first contact (electrode) 16 and second contact (electrode) 17. The first contact is an integral part of the first conductive film portion 11 and the second contact 17 extends to form a contact of thin film diode 18a. A semiconductor layer forms layer 14 which in this example is silicon rich non-stoichiometric silicon nitride.

As with the previous examples various ways of electrically connecting the thin film diodes with respect to other thin film diodes and the plates of the capacitor are possible to vary the current and voltage handling capacity of the protection element, as well as its operational characteristics. Again the specifications of the individual diodes may also be controlled and varied by altering their construction.

A thin film diode based on silicon rich amorphous alloy (such as silicon rich non-stoichiometric silicon nitride) can be very rugged whilst at the same time its leakage current can increase by over six orders of magnitude with increasing electric field. Therefore by connecting one or more small diodes of this type in parallel with the capacitor they contribute negligible capacitance and leakage current at normal operating voltages whilst enabling electrostatic build-up to leak away at high voltages.

For example, a thin film diode using silicon rich hydrogenated material having a band gap of 2.1 eV (electron volts) and a thickness of 2000 Å (angstroms) will operate with an electric field of $2 \times 10^5$ V.cm$^{-1}$ with a potential difference of 4V (volts) applied. The corresponding current will be in the order of $10^{-7}$ A.cm$^{-2}$. Therefore five, 50 $\mu$m (micrometre) ×50 $\mu$m (micrometre) diodes in series and connected in parallel with a thin film capacitor will contribute a leakage current of the order $2.5 \times 10^{-12}$A (amps) with 20V applied across the capacitor while the five diodes would exhibit an extra capacitance of just 0.2 pF. With 200V applied the leakage current increases by more than 7 orders of magnitude to more than $10^{-5}$A.

In this third embodiment the thin film diodes may alternatively be MIM devices of the type described above.

Figure 9:
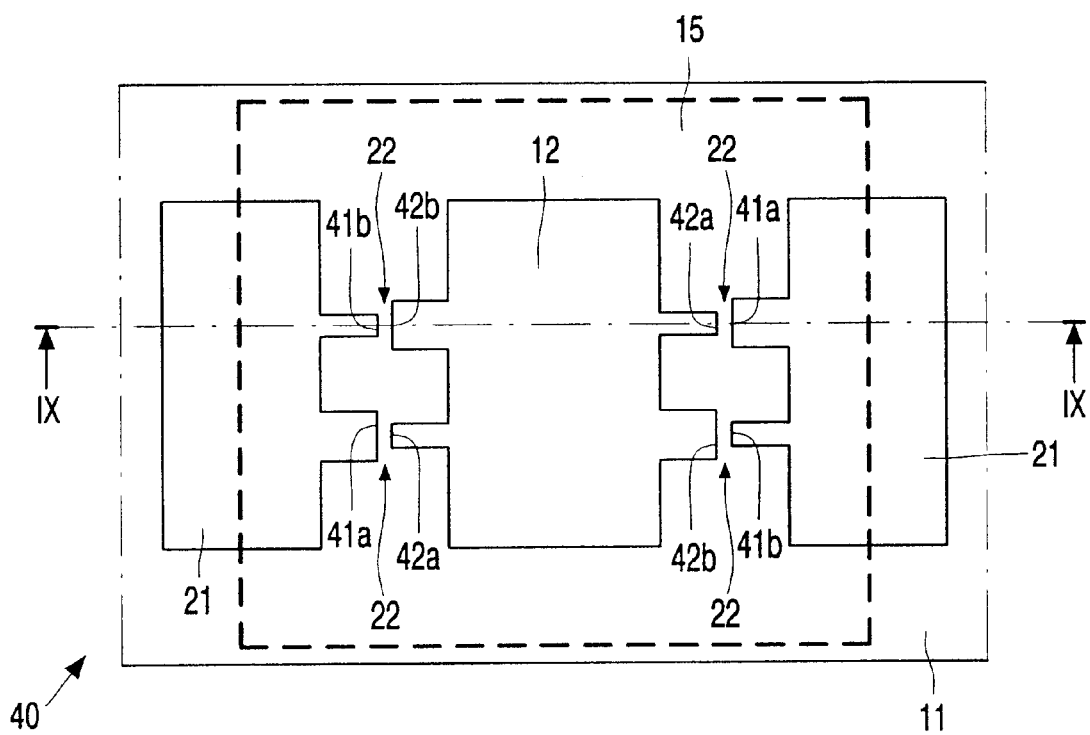
FIG. 9 is a plan view of a fourth embodiment of a thin film capacitor of the present invention.
Figure 10:
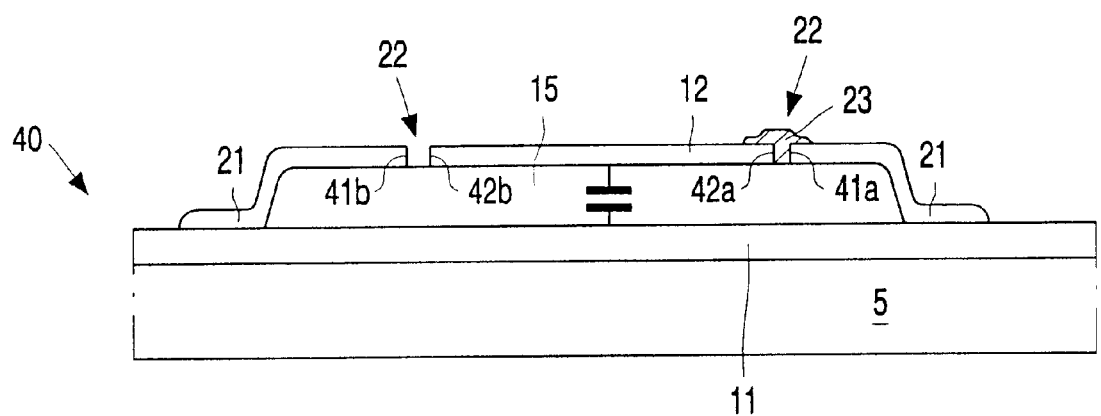
FIG. 10 is a cross-sectional view along the line IX—IX of FIG. 9.

Referring now to FIGS. 9 and 10 a fourth embodiment of a thin film capacitor 40 is shown, formed on substrate 5. The capacitor includes a capacitor element having a first conductive film portion 11 to provide a first plate of the capacitor, a second conductive film portion 12 to provide a second plate of the capacitor, and an insulating dielectric layer 15 to provide the capacitor dielectric. For example, the dielectric may be of silicon dioxide or nitride. Conductive transition portions 21 in electrical connection with the first conductive film portion 11 are provided. The conductive transition portions 21 are formed to extend into the same plane as the second conductive film portion 12 and terminate with edges 41a, 41b a small distance from edges 42a, 42b of the second conductive film portion 12. This serves to define discharge gaps 22 between edges 41a, 41b of the transition portions 21 and edges 42a, 42b respectively of the second conductive film portion 12. When a sufficiently high potential difference appears across the plates of the capacitor, the charge passes across the discharge gap rather than through the dielectric of the capacitor. Therefore transition portions 21, narrow gap 22 and edge regions 41a, 41b, 42a, 42b serve to provide the protection element. Typically the discharge gaps are in the order of a few micro metres wide, (for example in the range of 3–15 micro metres). Typically the gap is no larger than five times the thickness of the dielectric.

One specific way to produce a device of the type shown in the fourth embodiment is to deposit the top electrode and subsequently cut a narrow slot in it. This will divide the electrode into two parts and one of those parts is then connected to the bottom electrodes.

The discharge gap 22 of the fourth embodiment exposes a surface of the insulating dielectric 15. The exposed surface may be treated to modify the conducting nature of the surface as required. This could aid the transfer of charge across the gap to alter the characteristics of the protection element. One possibility is to apply a modifying layer 23 in the form of a resistive metallic layer to the exposed surface of the insulating dielectric. This would allow a parallel RC combination to be produced without the requirement for the use of any further masks during fabrication. Another possibility is to provide a modifying layer 23 in the form of a residue resulting from the application of carbon containing compounds or molecules. This can sometimes happen if carbon containing chemicals are used during the fabrication process. Alternatively, silicon rich non-stoichiometric silicon nitride could be introduced into the gap and the protection element would begin to function as a thin film diode as explained previously. The surface of layer 15 could be modified during the deposition process prior to the deposition of layers 12 and 21 to give it different electrical properties. The exposed surface of layer 15 could be damaged to induce defects and alter the conduction properties. This could be done by plasma etching.

Figure 11:
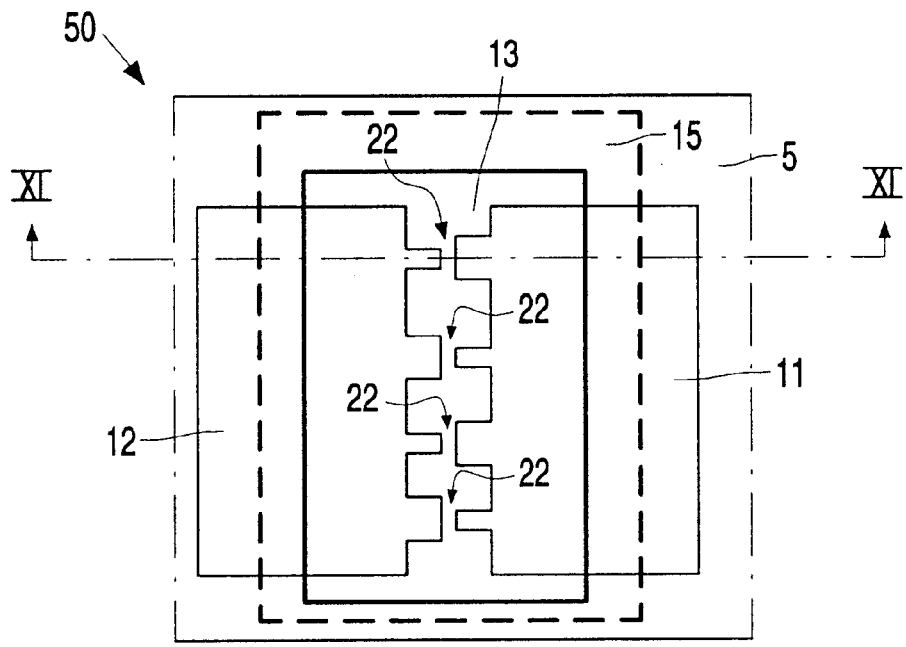
FIG. 11 is a plan view of a fifth embodiment of a thin film capacitor of the present invention.
Figure 12:
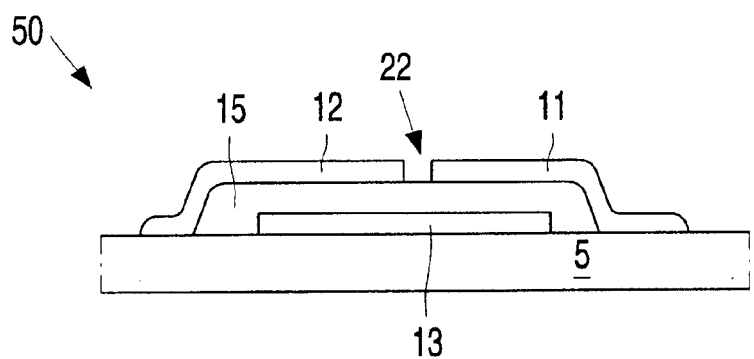
FIG. 12 is a cross-sectional view along the line XI—XI of FIG. 11.

FIGS. 11 and 12 show a fifth embodiment of the present invention which is a thin film capacitor 50 also having a protection element that operates on the same principle as the device shown in FIGS. 9 and 10, that is by using discharge gaps 22. The device in FIGS. 11 and 12 is provided with a first conductive film portion 11 and a second conductive film portion 12 that are coplanar, to form the first capacitor plate and the second capacitor plate respectively. A further conductive film portion 13 is provided which forms regions of overlap with each of the first and second conductive film portions, although there is no direct contact between any of the film portions. An insulating dielectric layer 15 provides the capacitor dielectric and this layer may be of stoichiometric silicon nitride, or silicon dioxide.

The first conductive film portion 11 and the second conductive film portion 12 cooperate to define narrow gap 22. When a sufficiently high potential difference appears across the first and second thin film portion, a charge passes across the narrow gap rather than through the dielectric of the capacitor. The presence of the narrow gap 22 produces an exposed surface of the dielectric material 15, and this surface may be treated as is discussed above for the fourth embodiment.

From reading the present disclosure other modifications will be apparent to persons skilled in the art. Such modifications may involve other features which are already known in the design, manufacture and use of thin-film devices and component parts thereof and which may be used instead of or in addition to features already described herein.

What is claimed is:

1. A thin film capacitor comprising a thin film structure on an insulating substrate, wherein the thin film structure provides a capacitor element including a dielectric film of the capacitor, and first and second conductive film portions which each provide a capacitor plate, and wherein the thin film structure also provides a protection element structurally integrated with and connected electrically in parallel with the capacitor element, the protection element having a conduction path that operates at a voltage lower than the breakdown voltage of the capacitor dielectric film.

2. A thin film capacitor in accordance with claim 1 wherein at least one of the first and second conductive film portions also provides an electrode of the protection element.

3. A thin film capacitor in accordance with claim 1 wherein the protection element is a thin film diode.

4. A thin film capacitor in accordance with claim 1 wherein the protection element comprises a plurality of thin film diodes electrically connected in series.

5. A thin film capacitor in accordance with claim 3 wherein the or each thin film diode is a MIM (metal-insulator-metal) type diode having an insulating layer which has a lower breakdown voltage than the capacitor dielectric and which thereby provides the conduction path of the protection element.

6. A thin film capacitor in accordance with claim 3 wherein the or each thin film diode is a metal-semiconductor-metal type diode having a silicon-rich non-stoichiometric silicon nitride semiconductor material, that provides the conduction path of the protection element.

7. A thin film capacitor in accordance with claim 1 wherein the protection element includes at least one discharge gap between third and fourth conductive film portions, the third conductive film portion is in electrical connection with one of the first and second conductive film portions, and the fourth conductive film portion is in electrical connection with the other one of the first and second conductive film portions.

8. A thin film capacitor in accordance with claim 7 wherein the discharge gap exposes a surface area of the dielectric film of the capacitor and the surface area has an enhanced conducting property.

9. A thin film capacitor in accordance with claim 1 wherein the protection element comprises a resistive element having a resistive film at a gap between third and fourth conductive film portions, the third conductive film portion is in electrical connection with one of the first and second conductive film portions, and the fourth conductive film portion is in electrical connection with the other one of the first and second conductive film portions.

10. A thin film capacitor in accordance with claim 7, wherein the third and fourth conductive film portions are integral with the respective first and second conductive film portion.

11. A thin film capacitor in accordance with claim 1 wherein the capacitor dielectric is stoichiometric silicon nitride.

* * * * *